(12) United States Patent
Morinaga (10) Patent No.: US 6,549,863 B1
(45) Date of Patent: Apr. 15, 2003

(54) APPARATUS AND METHOD FOR GENERATING MAP DATA

(75) Inventor: Kazunori Morinaga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 29 days.

(21) Appl. No.: 09/642,004

(22) Filed: Aug. 21, 2000

(30) Foreign Application Priority Data

Mar. 23, 2000 (JP) ........................................ 2000-082665

(51) Int. Cl.$^7$ ................................................ G06F 11/32
(52) U.S. Cl. ............................ 702/81; 702/104; 702/84
(58) Field of Search ............................ 702/81, 104, 84, 702/117; 382/145; 437/8; 371/43; 343/157; 324/765, 149; 438/14, 118; 257/48; 716/4; 365/201; 714/733, 742

(56) References Cited

U.S. PATENT DOCUMENTS

| | | | |
|---|---|---|---|
| 4,932,029 A | * 6/1990 | Heichler | ...................... 371/43 |
| 5,614,420 A | * 3/1997 | Sheu et al. | ...................... 437/8 |
| 5,787,190 A | 7/1998 | Peng et al. | |
| 6,128,403 A | * 10/2000 | Ozaki | ......................... 382/145 |
| 6,323,839 B1 | * 11/2001 | Fukuda et al. | ............... 345/157 |

FOREIGN PATENT DOCUMENTS

JP          10-178072          6/1998

* cited by examiner

*Primary Examiner*—Michael Nghiem
*Assistant Examiner*—Tung S Lau (57) ABSTRACT

Disclosed herein is a map data generating apparatus includes probers for generating map data from execution of each of a plurality of processes constituting wafer tests; and a cell controller for preserving the generated map data upon receipt thereof and for generating map data as final results in accordance with a classification code table combining classification codes for each of the processes in a manner determining final classification codes.

12 Claims, 11 Drawing Sheets

```
                    CLASSIFICATION
X L = 8             CODE OF (1, 1)
Y L = 8
M a p A = X  X  0  0  0  0  X  X
          X  0  0  0  0  0  0  X
          0  0  1  1  1  1  0  0
          0  0  1  1  1  1  0  0
          0  0  1  1  1  1  0  0
          0  0  1  1  1  1  0  0
          X  0  0  0  0  0  0  X
          X  X  0  0  0  0  X  X
```

| PROCESS A | PROCESS B | PROCESS C | FINAL RESULTS |
|---|---|---|---|
| 0 | 0 | 0 | A |
| 0 | 2 | 0 | B |
| 0 | 0 | 3 | C |
| 0 | 2 | 3 | D |
| 1 | 0 | 0 | E |
| 1 | 2 | 0 | F |
| 1 | 0 | 3 | G |
| 1 | 2 | 3 | H |

Fig. 8

XL = 8
YL = 8
MapF = X X A A A A X X
          X A B B A A A X
          A A F F E E A A
          A A F F E E A A
          A C H H G G C A
          A C H H G G C A
          X A B B A A A X
          X X A A A A X X

Fig. 9

| PROCESS A | PROCESS B | PROCESS C | FINAL RESULTS |
|---|---|---|---|
| 0 = 3 6<br>1 = 1 6<br>X = 1 2 | 0 = 4 0<br>2 = 1 2<br>X = 1 2 | 0 = 4 0<br>3 = 1 2<br>X = 1 2 | A = 2 8<br>B = 4<br>C = 4<br>D = 0<br>E = 4<br>F = 4<br>G = 4<br>H = 4<br>X = 1 2 |

Fig. 10A

AND OPERATION

P1 AND P2 = P p p
P1 AND F2 = F p f
F1 AND P2 = F f p
F1 AND F2 = F f f

Fig. 10B

OR OPERATION

NW OPERATION

BF OPERATION

| PROCESS A | PROCESS B | PROCESS C |
|---|---|---|
| NW | OR<br>P p p = Pa<br>P p f = Pb<br>P f p = Pb<br>F f f = Fc | OR<br>P p p = Pd<br>P p f = Pe<br>P f p = Pe<br>F f f = Ff |

```
XL = 8
YL = 8
MapB' = MapA AND MapB
      = X  X  Fc Fc Fc Fc X  X
        X  Fc Pb Pb Fc Fc Fc X
        Fc Fc Pa Pa Pb Pb Fc Fc
        Fc Fc Pa Pa Pb Pb Fc Fc
        Fc Fc Pa Pa Pb Pb Fc Fc
        Fc Fc Pa Pa Pb Pb Fc Fc
        X  Fc Pb Pb Fc Fc Fc X
        X  X  Fc Fc Fc Fc X  X
```

Fig. 14

```
XL = 8
YL = 8
MapC' = MapB' AND MapC
      = X  X  Ff Ff Ff Ff X  X
        X  Ff Pe Pe Ff Ff Ff X
        Ff Ff Pe Pe Pe Pe Ff Ff
        Ff Ff Pe Pe Pe Pe Ff Ff
        Ff Pe Pd Pd Pd Pd Pe Ff
        Ff Pe Pd Pd Pd Pd Pe Ff
        X  Ff Pe Pe Ff Ff Ff X
        X  X  Ff Ff Ff Ff X  X
```

Fig. 15

| PROCESS A | PROCESS B | PROCESS C | FINAL RESULTS |
|---|---|---|---|
| 0 = 1 6 | Pa = 8 | Pd = 8 | Pd = 8 |
| 1 = 3 6 | Pb = 1 2 | Pe = 1 6 | Pe = 1 6 |
|  | Fc = 3 2 | Ff = 2 8 | Ff = 2 8 |

Fig. 16

```
X L = 8
Y L = 8                                    P1
Map A = X  X  0  0  0  0  X  X
        X  0  0  0  0  0  0  X
        0  0  1  1  1 [1] 0  0
        0  0  1  1  1  1  0  0
        0  0  1  1  1  1  0  0
        0  0  1  1  1  1  0  0
        X  0  0  0  0  0  0  X
        X  X  0  0  0  0  X  X
```

Fig. 17

```
X L = 8
Y L = 8                                    P2
Map B = X  X  0  0  0  0  X  X
        X  0  2  2  0  0  0  X
        0  0  2  2  0 [0] 0  0
        0  0  2  2  0  0  0  0
        0  0  2  2  0  0  0  0
        0  0  2  2  0  0  0  0
        X  0  2  2  0  0  0  X
        X  X  0  0  0  0  X  X
```

Fig. 18

| PROCESS A | | | PROCESS B | | | PROCESS C | | |
|---|---|---|---|---|---|---|---|---|
| PREVIOUS PROCESS | CURRENT PROCESS | RESULT | PREVIOUS PROCESS | CURRENT PROCESS | RESULT | PREVIOUS PROCESS | CURRENT PROCESS | RESULT |
| NO CODES | 0 | A0 | A0 | 0 | B0 | B0 | 0 | A |
| NO CODES | 1 | A1 | A0 | 2 | B1 | B0 | 3 | C |
|  |  | A0 | A1 | 0 | B2 | B1 | 0 | B |
|  |  | A1 | A1 | 2 | B3 | B1 | 3 | D |
|  |  |  |  |  |  | B2 | 0 | E |
|  |  |  |  |  |  | B2 | 3 | G |
|  |  |  |  |  |  | B3 | 0 | F |
|  |  |  |  |  |  | B3 | 3 | H |

XL = 8
YL = 8
MapB'

XL = 8
YL = 8
MapB'

XL = 8
YL = 8
MapC'

```
= X X A A A A X X
  X A B B A A A X
  A A F F E E A A
  A A F F E E A A
  A C H H G G C A
  A C H H G G C A
  X A B B A A A X
  X X A A A A X X
```

APPARATUS AND METHOD FOR GENERATING MAP DATA

BACKGROUND OF THE INVENTION

1. Field of the Invention

The present invention relates to techniques for generating, as electronic information, classification codes regarding individual semiconductor chips tested in a wafer state. More particularly, the invention relates to an apparatus and a method for generating map data whereby some of the semiconductor chips rejected as defective in one test process but accepted as normal in another during multiple-process wafer testing are recovered as still useful in a way distinct from normally accepted chips.

2. Description of the Background Art

Conventional map data generating apparatuses typically have one storage area for accommodating a classification code regarding each of all chips making up a wafer. Final classification codes are obtained by overwriting the latest data with map data created in each process. Whereas chips judged flawless in all processes are accepted with no problem, those chips that were accepted as normal in a first process yet rejected as defective in an ensuing process are discarded traditionally because the final classification codes are written as defective. Some of the discarded faulty chips have been judged defective simply because of, say, relatively low operating speeds and have been highly likely to be still useful in a way different from normally accepted chips.

One disadvantage of the conventional map data generating apparatus is that once it judges semiconductor chips faulty, there is little possibility of having any of the discarded chips recovered as still useful in a way distinct from those judged normal.

SUMMARY OF THE INVENTION

It is therefore an object of the present invention to overcome the above and other deficiencies of the prior art and to provide an apparatus and a method for generating map data whereby some of the semiconductor chips rejected as faulty in one test process but accepted as normal in another during multiple-process wafer testing are recovered as still useful in a way different from normally accepted chips.

The above objects of the present invention are achieved by a map data generating apparatus described below. The apparatus includes probers for generating map data from execution of each of a plurality of processes constituting wafer tests. The apparatus also includes a cell controller for preserving the generated map data upon receipt thereof and for generating map data as final results in accordance with a classification code table which determines final classification codes by combining classification codes for each of the plurality of processes.

The above objects of the present invention are also achieved by a map data generating apparatus described below. The apparatus includes probers for generating map data from execution of each of a plurality of processes constituting wafer tests. The apparatus further includes a cell controller for preserving the generated map data upon receipt thereof and for generating final classification codes through logical operations on the basis of a classification code obtained before a current process and a classification code obtained in the current process.

The above objects of the present invention are achieved by a map data generating method described below. In the method, map data are generated from execution of each of a plurality of processes constituting wafer tests. The method includes a step of generating map data as final results in accordance with a classification code table which determines final classification codes by combining classification codes for each of the plurality of processes.

Other objects and further features of the present invention will be apparent from the following detailed description when read in conjunction with the accompanying drawings.

DESCRIPTION OF THE PREFERRED EMBODIMENTS

First Embodiment

Figure 1:
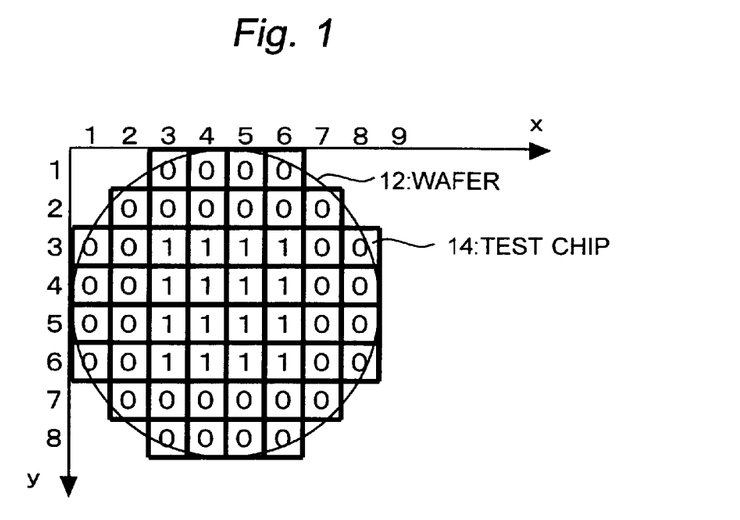
FIG. 1 is a wafer map showing a range of test chips and test results.

The first embodiment of this invention will now be described in detail with reference to the accompanying drawings. FIG. 1 is a typical wafer map showing a range of test chips and test results. In FIG. 1, reference numeral 12 denotes a wafer and 14 represents test chips. The axis of abscissa stands for crosswise coordinates (chip coordinates x) and the axis of ordinate for longitudinal coordinates (chip coordinates y). Numerals given within the test chips 14 each denote a classification code indicating the result of a test on the chip in question.

A map data generating apparatus practiced as the first embodiment of this invention tests the wafer 12 having the chips 14 extended as shown in FIG. 1. A "normal" or "faulty" product classification code is generated for each test chip 14.

Figure 2:
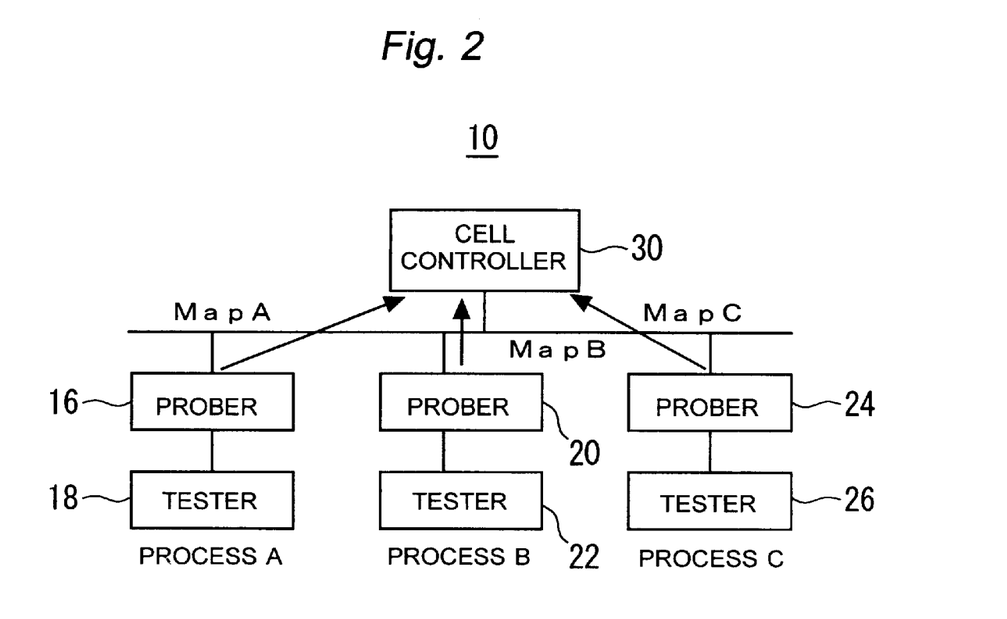
FIG. 2 is a schematic flowchart for explaining wafer testing.
Figure 3:
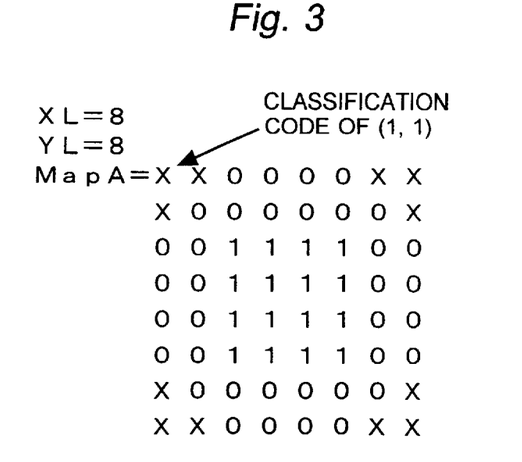
FIG. 3 is a table of map data from a process A of a first embodiment of this invention.

FIG. 2 is a schematic flowchart outlining how the wafer 12 is tested. FIG. 3 is a table of map data from a process A of the first embodiment. In FIG. 2, reference numeral 10 stands for the map data generating apparatus; 16, 20 and 24 denote probers; 18, 22 and 26 represent testers; and 30 indicates a cell controller.

In the process A of FIG. 2, the wafer 12 is loaded into the prober 16. The test chips 14 are tested individually by the tester 18 allowing the prober 16 to create map data MapA shown in FIG. 3. In FIG. 3, a classification code "X" stands for the absence of a test chip, "0" for a faulty chip, "1" for a normal chip, "XL" for a crosswise data count, and "YL" for a longitudinal data count. The map data MapA indicated in FIG. 3 are transmitted as shown in FIG. 2 from the prober 16 to the cell controller 30 for storage in the latter.

Figure 4:
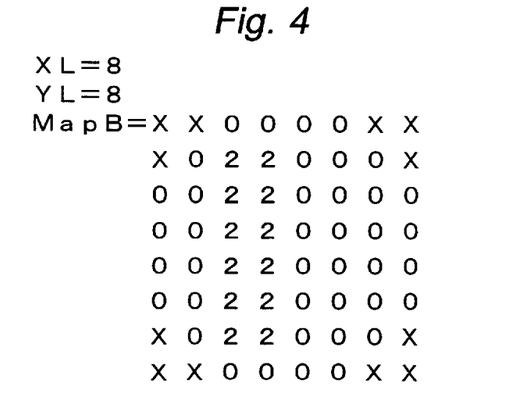
FIG. 4 is a table of map data from a process B of the first embodiment.

FIG. 4 is a table of map data from a process B of the first embodiment. In the process B shown in FIG. 2, the wafer 12 is loaded into the prober 20. The test chips 14 are tested individually by the tester 22 allowing the prober 20 to create map data MapB given in FIG. 4. In FIG. 4, a classification code "X" stands for the absence of a test chip, "0" for a faulty chip, "2" for a chip judged normal in the process B, "XL" for a crosswise data count, and "YL" for a longitudinal data count. The map data MapB indicated in FIG. 4 are transmitted as shown in FIG. 2 from the prober 20 to the cell controller 30 for storage in the latter.

Figure 5:
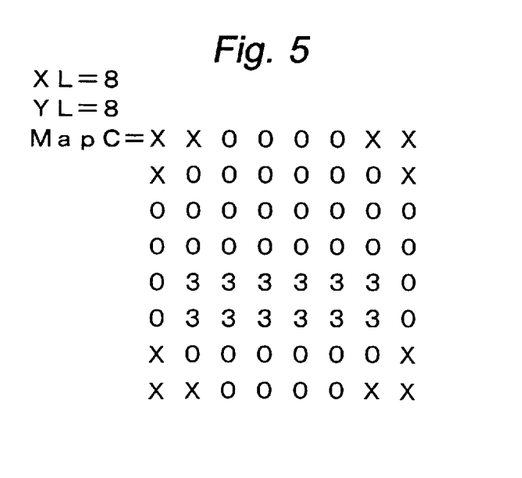
FIG. 5 is a table of map data in a process C of the first embodiment.

FIG. 5 is a table of map data in the final process C of the first embodiment. In the process C shown in FIG. 2, the wafer 12 is loaded into the prober 24. The test chips 14 are tested individually by the tester 26 allowing the prober 24 to create map data MapC illustrated in FIG. 5. In FIG. 5, a classification code "X" stands for the absence of a test chip, "0" for a faulty chip, "3" for a chip judged normal in the final process C, "XL" for a crosswise data count, and "YL" for a longitudinal data count. The map data MapC depicted in FIG. 5 are transmitted as shown in FIG. 2 from the prober 24 to the cell controller 30 for storage in the latter.

Following the above processes, the cell controller 30 in FIG. 2 holds the map data MapA, MapB and MapC.

Figure 6:
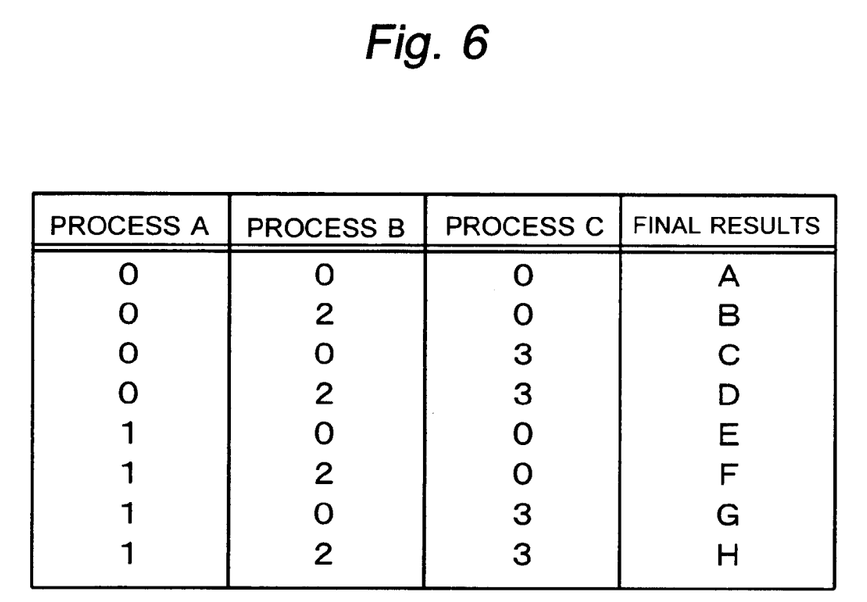
FIG. 6 is a table that lists a first example of operation settings.

How the cell controller 30 works will now be described. FIG. 6 is a table that lists a first example of operation settings.

The map data generating apparatus 10 of the first embodiment establishes in the cell controller 30 a first example of operation settings shown in FIG. 6. More specifically, as depicted in FIG. 6, the operation settings comprise test results represented by the classification codes "0" and "1" from the process A, "0" and "2" from the process B, and "0" and "3" from the process C. Thus a total of eight transition cases classified as "A" through "H" are derived from the results of the tests on the test chips 14. It is assumed that the absence of chips is always represented by the classification code "X."

Upon receipt of the map data MapC from the last process C, the cell controller 30 stores the received data while simultaneously assigning classification codes "A" through "H" to the individual test chips 14 on the basis of the map data MapA, MapB and MapC. The results of the tests are processed by the cell controller 30 as depicted in the flowchart of FIG. 7.

Figure 7:
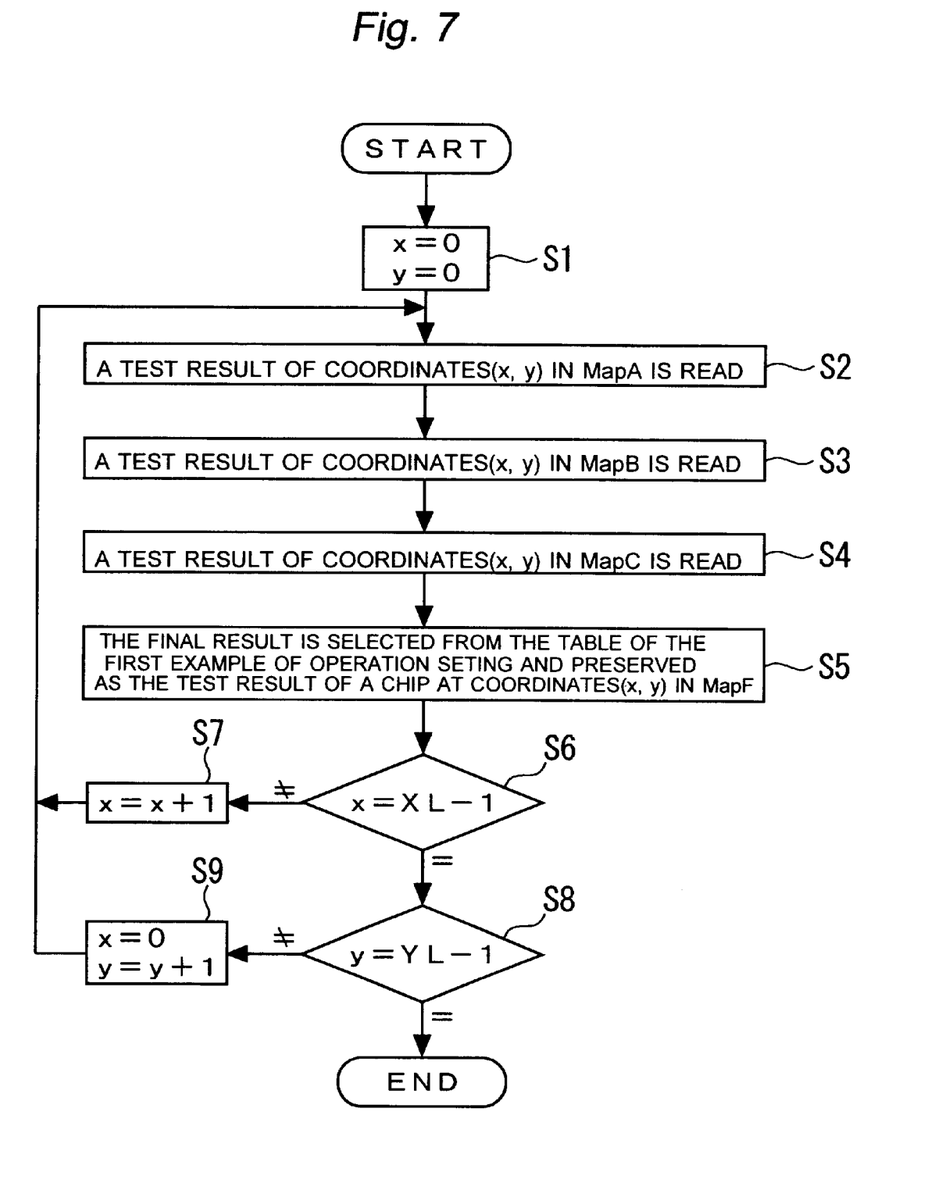
FIG. 7 is a flowchart for explaining a map data generating method practiced as the first embodiment.
Figure 8:
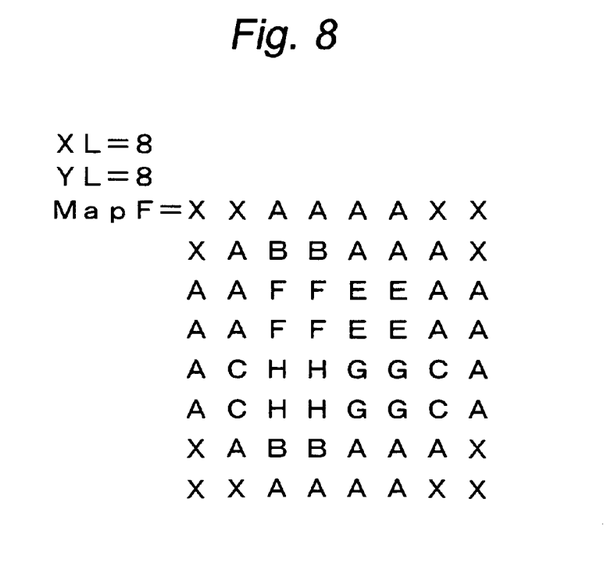
FIG. 8 is a table that lists operation results from the first example in FIG. 6.
Figure 9:
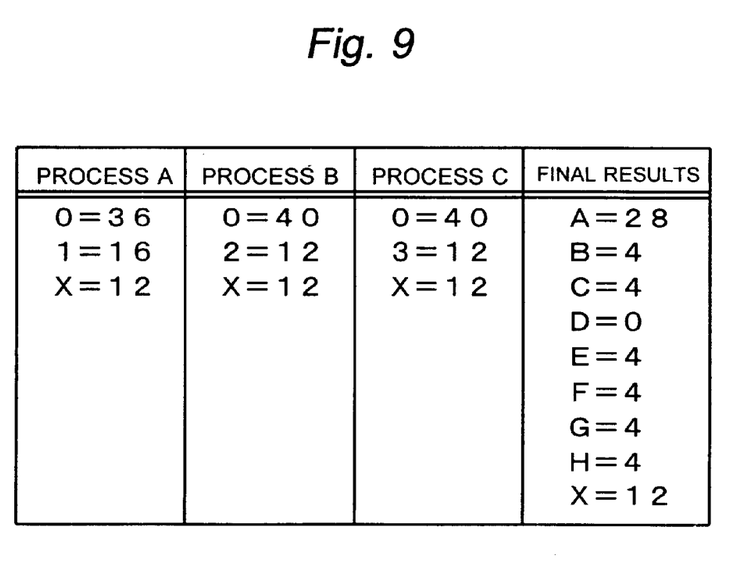
FIG. 9 is a table that lists results totaled by classification number from t e first example of FIG. 6.

FIG. 7 shows a flow of steps outlining how map data are generated by the first embodiment. FIG. 8 is a table that lists operation results from the first example of operation settings in FIG. 6. FIG. 9 is a table that lists results totaled by classification number from the first example in FIG. 6. Coordinates (x, y) in the flowchart of FIG. 7 point to each test chip 14 (i.e., chip coordinates). From the results of FIG. 8, the number of chips is totaled for each of the different classification codes. The resulting counts are listed in FIG. 9.

According to the map data generating method of the first embodiment, as shown in FIG. 7, the coordinates (x, y) of a given test chip 14 are initially set to (0, 0) in step S1. The result of the test on the chip identified by the coordinates (x, y) in the map data MapA is read in step S2. The result of the test at the coordinates (x, y) in the map data MapB is then read in step S3. The test result at the coordinates (x, y) in the map data MapC is read next in step S4. From the table of the first example of operation settings, the final result is selected and preserved in step S5 as the test result on the test chip 14 at the coordinates (x, y) in map data MapF.

The coordinate x of the test chip 14 is compared with the crosswise data count minus one (=XL−1) in step S6. If the coordinate x of the test chip 14 is found equal to the crosswise data count minus one, then step S8 is reached. If the coordinate x is not equal to the crosswise data count minus one, then the coordinate x is incremented by one (x=x+1) and step S2 is reached again.

The coordinate y of the test chip 14 is compared with the longitudinal data count minus one (=YL−1) in step S8. If the coordinate y of the test chip 14 is judged equal to the longitudinal data count minus one, then the processing is terminated (END). If the coordinate y is not equal to the longitudinal data count minus one, then zero is inserted to the coordinate x and the coordinate y is incremented (y=y+1) before step S2 is reached again.

If the result from the process A is not deemed satisfactory, another series of tests may be carried out to create the latest map data MapA. The final results may then be calculated based on the map data MapA generated in this manner.

The classification codes "B" through "H" denote chips that have been judged normal in any one of the processes A, B and C. These codes allow the chips to be recovered as still useful in a manner different from normally accepted chips. The classification codes "B" through "H" also permit the apparently faulty chips to be grouped in a more detailed and recoverable fashion than before.

Second Embodiment

The second embodiment of this invention will now be described in detail with reference to the relevant drawings. Where the first embodiment described above is used to obtain classification codes as the final results, it is necessary to establish all conceivable patterns that may be generated for each classification code created in each process. Thus there may be cases involving huge numbers of settings that are required. The second embodiment is provided to address such cases.

The same conditions for the first embodiment shown in FIGS. 1 through 5 are also set for the second embodiment. The cell controller 30 has its operation definitions established inside as shown in FIGS. 10A through 10D. Specifically, a classification code "P1" is a generic classification code of chips judged normal in up to the preceding process, "P2" a generic classification code of chips judged normal in the current process, "F1" a generic classification code of chips judged faulty in up to the preceding process, and "F2" a generic classification code of chips judged faulty in the current process.

Figure 15:
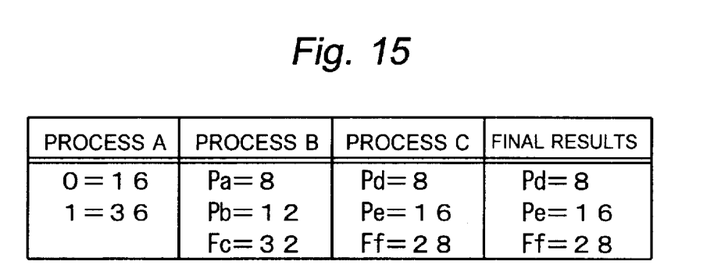
FIG. 15 is a table that lists results totaled by classification number from the second example of operation settings through the use of the second embodiment.
Figure 16:
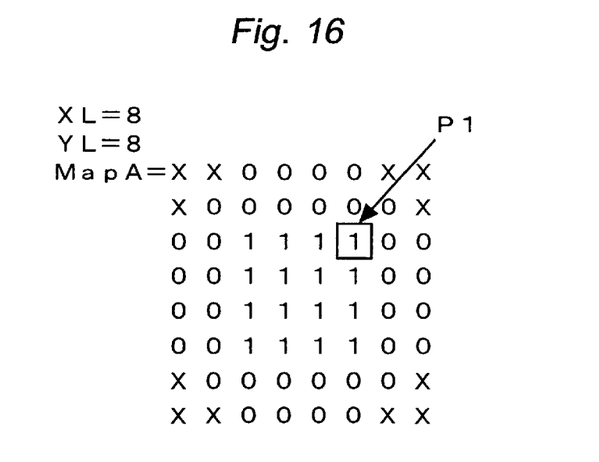
FIG. 16 is a table of map data from a process A of the second embodiment.
Figure 17:
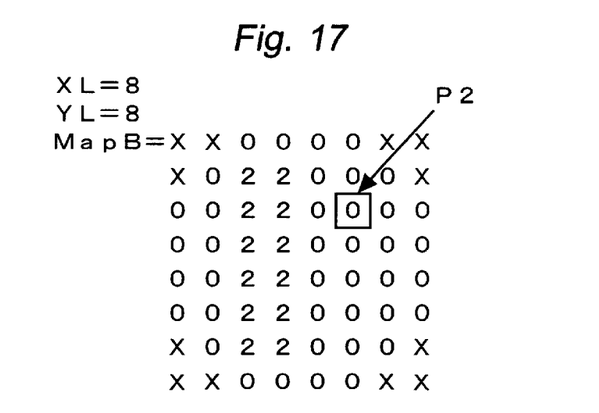
FIG. 17 is a table of map data from a process B of the second embodiment.

FIG. 15 is a table that lists results totaled by classification number from the second example of operation settings through the use of the second embodiment. FIG. 16 is a table of map data from a process A of the second embodiment. FIG. 17 is a table of map data from a process B of the second embodiment. For the map data generating apparatus 10 of the second embodiment, there exists illustratively a normal test chip 14 whose classification code is set to "1" as illustrated in FIG. 16. In FIG. 17, the same chip is shown to have the classification code "0" identifying a faulty chip. In that case, the classification code "P1" is changed to "1," "P2" to "0." If a classification code "Ppp" is set for "Pa" (to be described later in reference to FIG. 11), then this test chip 14 turns out to be normal and its classification code is replaced by "Pa."

Figure 10A:
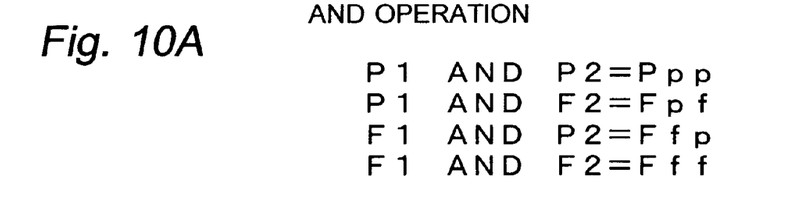
FIGS. 10A through 10D are tables that list definitions of logical expressions.

FIGS. 10A through 10D are tables that list definitions of logical operation expressions. In FIG. 10A, a definition "P1 AND P2=Ppp" signifies a logical operation whereby test chips 14 with their classification code switched from "P1" in up to the preceding process to "P2" in the current process are all assigned a classification code "Ppp" identifying normal chips.

The AND operations shown in FIG. 10A are defined as consisting of two types. One type of operation assigns a "normal" product classification code to chips judged normal both in up to the preceding process and in the current process. The other type of operation assigns a "faulty" product classification code to all other chips.

The classification code "P1" stands for a "normal" result from up to the preceding process, "F1" for a "faulty" result from up to the preceding process, "P2" for a "normal" result from the current process, and "F2" for a "faulty" result from the current process.

Classification codes "Ppp," "Fpf," "Ffp" and "Fff" are used as labels under which the detailed classification codes are grouped in accordance with the results of the logical operations.

Figure 10B:
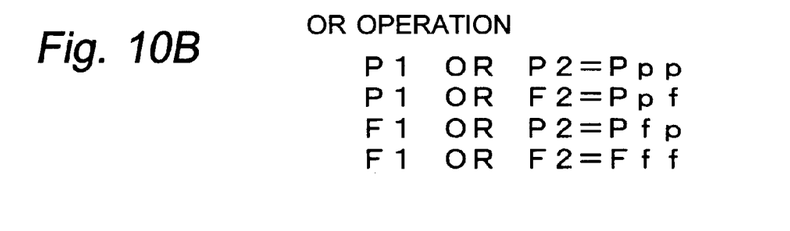

The OR operations shown in FIG. 10B are also defined as consisting of two types. One type of operation assigns a "normal" product classification code to chips judged normal either in up to the preceding process or in the current process. The other type of operation assigns a "faulty" product classification code to all other chips.

Figure 10C:
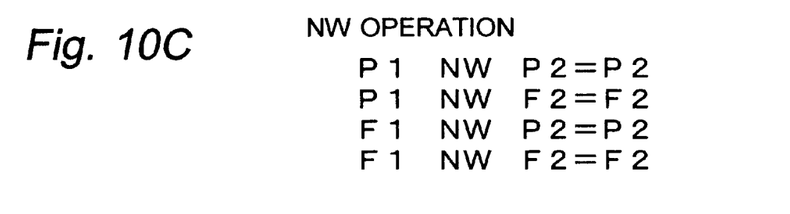
Figure 10D:
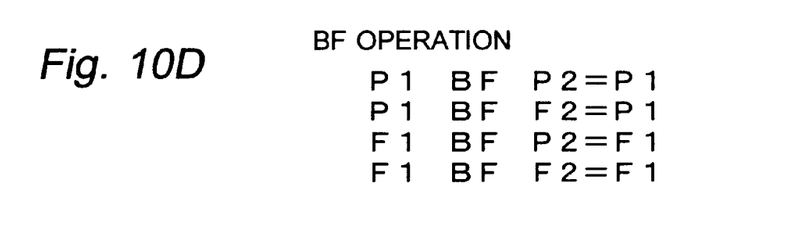

The NW operations shown in FIG. 10C are defined whereby classification codes from the current process are adopted. The BF operations given in FIG. 10D are defined whereby classification codes from up to the preceding process are adopted.

Figure 11:
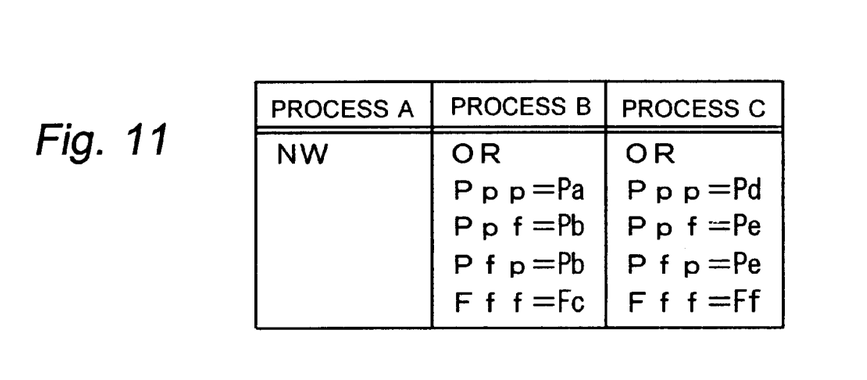
FIG. 11 is a table that lists a second example of operation settings.

Below is a more detailed description of the second embodiment of this invention. FIG. 11 is a table that lists a second example of operation settings. As shown in FIG. 11, each process is selectively assigned any one of the AND, OR, NW and BF operations above. If the AND or OR operation is selected for a given process, classification codes are set so as to reflect the operation results from the process. Specifically, for the process B in FIG. 11, the OR operation is selected whereby the "normal" product classification code "Ppp" is replaced by "Pa," the "normal" product classification codes "Ppf" and "Pfp" are replaced by "Pb," and the "faulty" product classification code "Fff" is replaced by "Fc."

Figure 12:
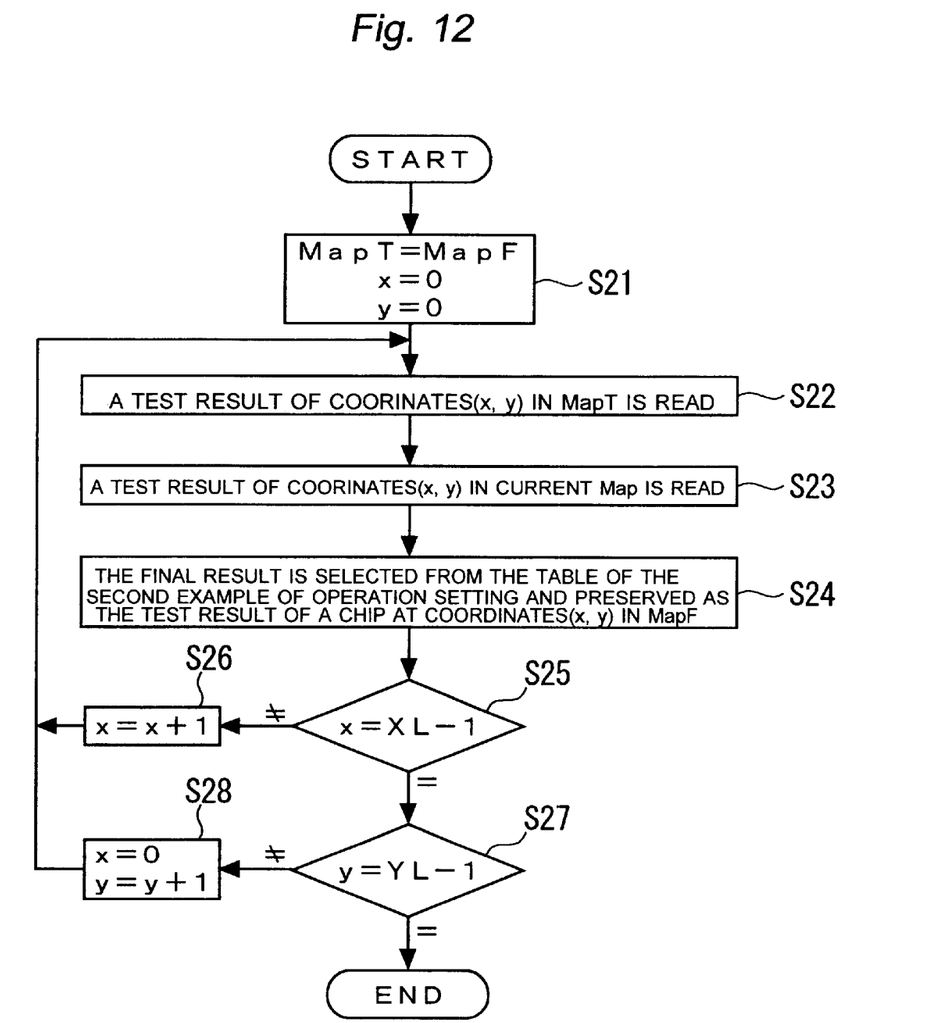
FIG. 12 is a flowchart for explaining a map data generating method practiced as a second embodiment of this invention.

FIG. 12 is a flowchart for explaining a map data generating method practiced as the second embodiment of this invention. FIG. 3 is a table that lists results of operations performed by the second embodiment on map data MapA and map data MapB.

According to the map data generating method of the second embodiment, as shown in FIG. 12, the map data MapF are substituted for the map data MapT while the coordinates (x, y) of a given test chip 14 are set to (0, 0) in step S21. The result of the test at the coordinates (x, y) in the map data MapT is read in step S22. The test result at the coordinates (x, y) of current map is read in step S23. From the table of the second example of operation settings, the final result is selected and preserved in step S24 as the test result on the test chip 14 at the coordinates (x, y) in the map data MapF.

The coordinate x of the test chip 14 is compared with the crosswise data count minus one (=XL−1) in step S25. If the coordinate x of the test chip 14 is found equal to the crosswise data count minus one, then step S27 is reached. If the coordinate x is not equal to the crosswise data count minus one, then the coordinate x is incremented by one (x=x+1) and step S22 is reached again.

The coordinate y of the test chip 14 is compared with the longitudinal data count minus one (=YL−1) in step S27. If the coordinate y of the test chip 14 is judged equal to the longitudinal data count minus one, then the processing is terminated (END). If the coordinate y is not equal to the longitudinal data count minus one, then zero is inserted to the coordinate x and the coordinate y is incremented (y y+1) before step S22 is reached again.

Figure 13:
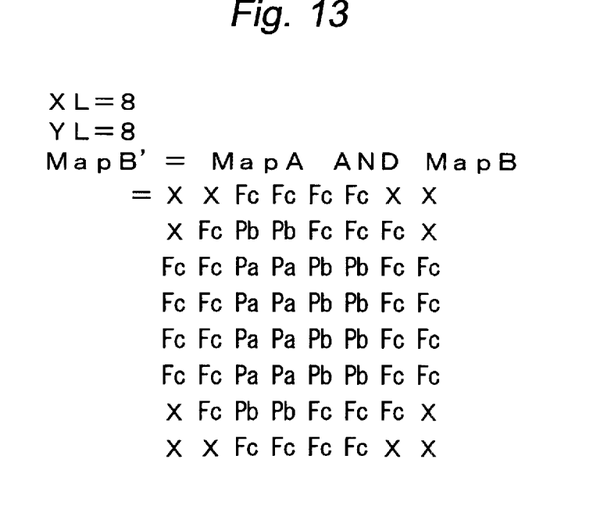
FIG. 13 is a table that lists results of operations performed,by the second embodiment on map data MapA and map data MapB.

After the map data MapA from the process A in FIG. 3 and the map data MapB from the map in FIG. 4 are operated on as depicted in the flowchart of FIG. 12, map data MapB' shown in FIG. 13 are provided.

Figure 14:
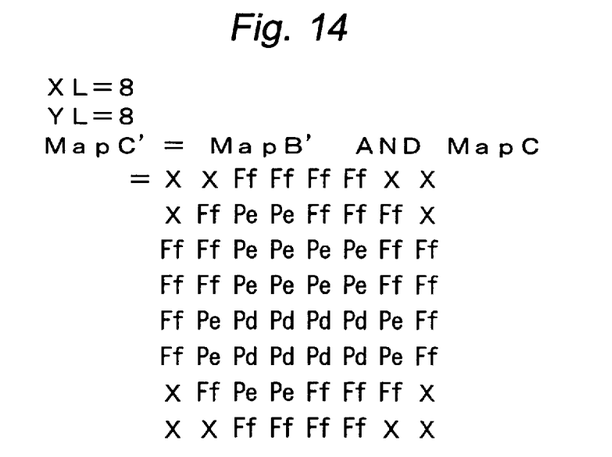
FIG. 14 is a table that lists results of operations performed,by the second embodiment on map data MapB' and map data MapC.

FIG. 14 is a table that lists results of operations performed by the second embodiment on the map data MapB' and map data MapC. The second embodiment operates on the map data MapB' in FIG. 13 and on map data MapC from the current process in FIG. 5 in accordance with the settings of the final process C in FIG. 11 and in keeping with the flowchart of FIG. 12. The results of the operations are map data MapC' in FIG. 14.

As described above, the second embodiment eliminates the need for making further operation settings to each new classification code that may be added. That is, the number of settings is kept from growing in proportion to the increasing number of classification codes. Another benefit of the second embodiment is that the test chips 14 judged faulty in one of the processes involved can be recovered as still useful in a manner different from normally accepted chips.

Third Embodiment

The third embodiment of this invention will now be described in detail with reference to the relevant drawings.

Figure 18:
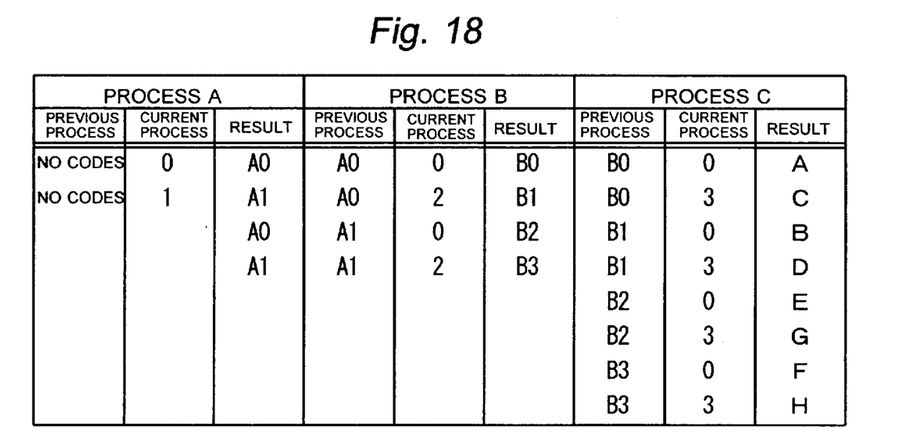
FIG. 18 is a table that lists a third example of operation settings used by a third embodiment of this invention.
Figure 19:
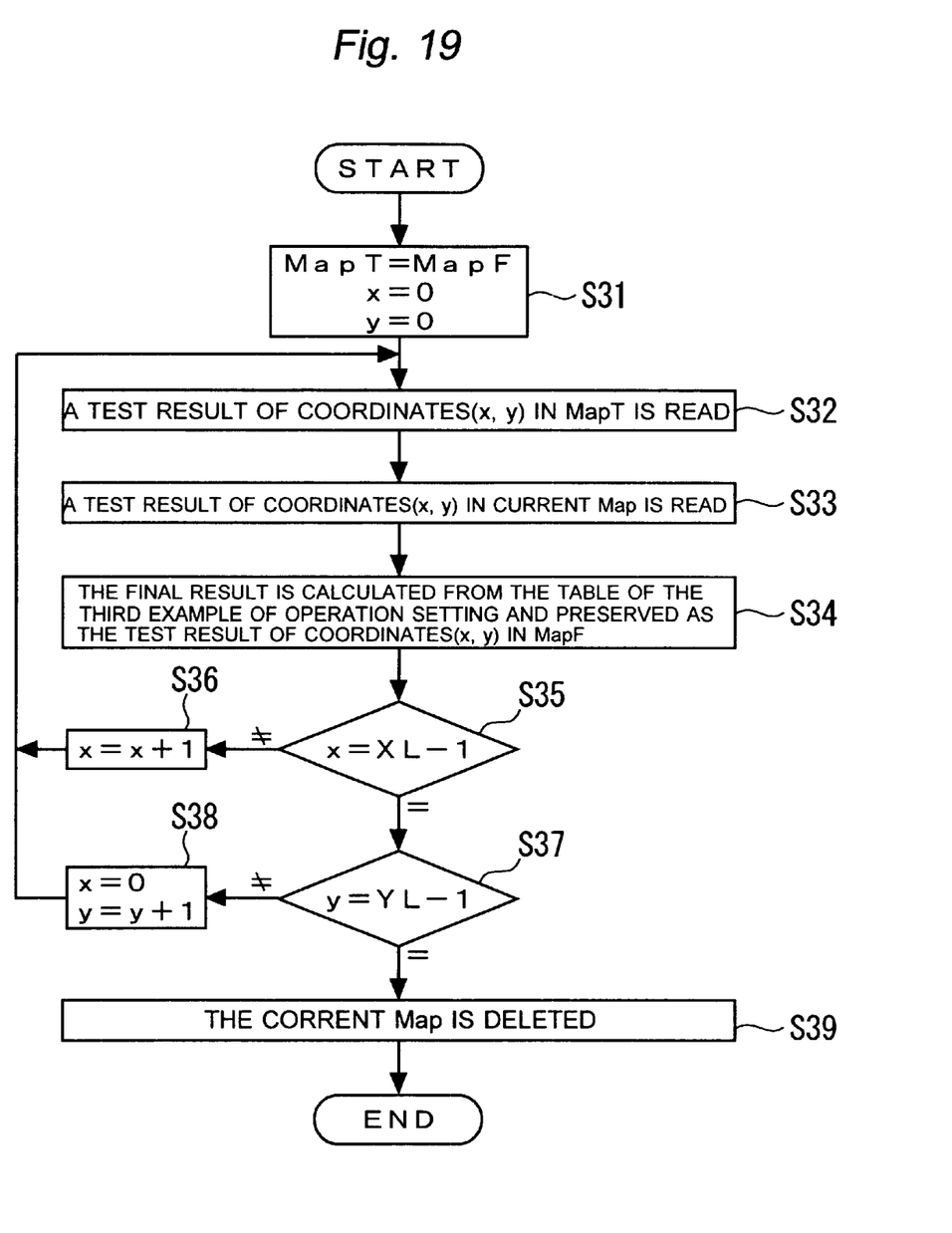
FIG. 19 is a flowchart for explaining a map data generating method practiced as the third embodiment.
Figure 20:
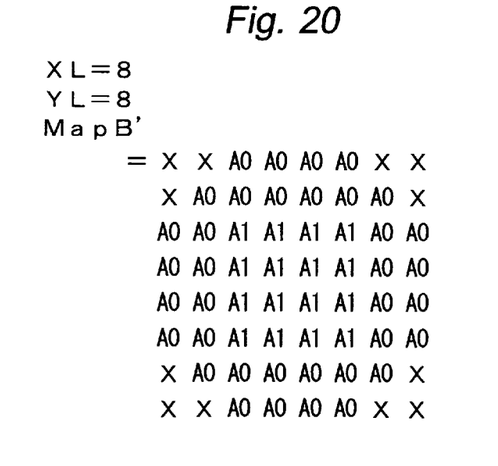
FIG. 20 is a table that lists results of operations performed by the third embodiment on map data MapA and map data MapB.

FIG. 18 is a table that lists a third example of operation settings used by the third embodiment. FIG. 19 is a flowchart outlining how a map data generating method practiced as the third embodiment works. FIG. 20 is a table that lists results of operations performed by the third embodiment on the map data MapA and map data MapB.

Where the above-described first embodiment is in use, the map data MapA, MapB and MapC generated from each of the processes involved must be preserved until the final process C is completed and the final results are obtained. In such a case, a growing number of processes could lead to an inordinately large memory capacity required. The third embodiment is designed to circumvent that eventuality.

The map data generating apparatus 10 of the third embodiment processes classification codes in each of its processes as shown in the third example of operation settings in FIG. 18. In the process A, as depicted in the flowchart of FIG. 19, the latest map data MapF in FIG. 20 are generated on the basis of the map data MapA while the map data MapB are deleted.

More specifically, as shown in FIG. 19, the map data generating method of the third embodiment first substitutes the map data MapF for the map data MapT and sets coordinates (x, y) of a given test chip 14 to (0, 0) in step S31. The result of the test at the coordinates (x, y) in the map data MapT is read in step S32. The test result at the coordinates (x, y) in the map data from the current process is then read in step S33. From the table of the third example of operation settings, the final result is selected and preserved in step S34 as the test result on the test chip 14 at the coordinates (x, y) in the map data MapF.

The coordinate x of the test chip 14 is compared with the crosswise data count minus one (=XL−1) in step S35. If the coordinate x of the test chip 14 is found equal to the crosswise data count minus one, then step S37 is reached. If the coordinate x is not equal to the crosswise data count minus one, then the coordinate x is incremented by one (x=x+1) and step S32 is reached again.

The coordinate y of the test chip 14 is compared with the longitudinal data count minus one (=YL−1) in step S37. If the coordinate y of the test chip 14 is judged equal to the longitudinal data count minus one, then the map data from the current process are deleted in step S39 and the processing is terminated (END). If the coordinate y is not equal to the longitudinal data count minus one, then zero is inserted to the coordinate x and the coordinate y is incremented (y=y+1) before step S32 is reached again.

Figure 21:
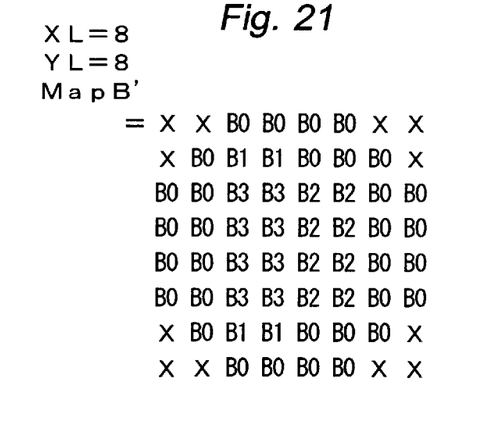
FIG. 21 is a table that lists results of operations performed by;the third embodiment on map data Map' and map data MapC.

FIG. 21 is a table that lists results of operations performed by the third embodiment on the map data MapB' and map data MapC. By following the steps in FIG. 19, the map data generating apparatus 10 of the third embodiment operates in the process B on the map data MapB' and on the latest map data MapC so as to generate the most recent map data MapF shown in FIG. 21.

Figure 22:
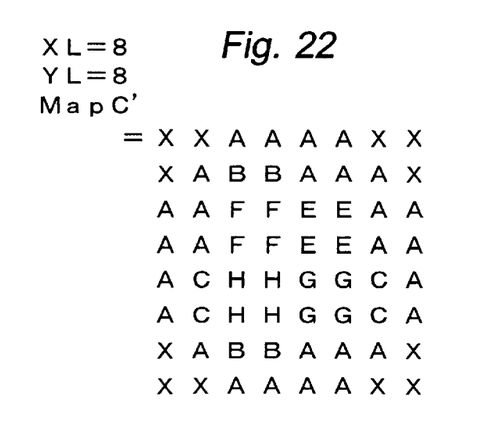
FIG. 22 is a table that lists results of operations performed by the third embodiment on map data MapF and map data MapC.

FIG. 22 is a table that lists results of operations performed by the third embodiment on the map data MapF and map data MapC. By following the steps in FIG. 19, the third embodiment operates likewise in the final process C on the map data MapF and on the latest map data MapC so as to generate the most recent map data MapF shown in FIG. 22 while deleting the map data MapC.

As described, the third embodiment groups the classification codes into eight categories "A" through "H," the same as with the first embodiment. In addition, the map data MapA, MapB and MapC generated in each process need only be preserved temporarily while the process in question is in progress; there is no need to retain all map data until the final process C is completed. This makes it possible to reduce appreciably the memory capacity necessary for data storage.

Although the description above contains many specificities, these should not be construed as limiting the scope of the invention but as merely providing illustrations of some of the presently preferred embodiments of this invention. It is to be understood that changes and variations may be made without departing from the spirit or scope of the claims that follow. For example, the number of the inventive components described above, their locations and their shapes are not limitative of the invention and may be varied as needed in practicing the invention under given-circumstances. Throughout the accompanying drawings, like reference numerals denote like or corresponding parts.

The major benefits of the present invention described above are summarized as follows:

According to a first aspect of the invention, there is provided a map data generating apparatus comprising: probers for generating map data from execution of each of a plurality of processes constituting wafer tests; and a cell controller for preserving the generated map data upon receipt thereof and for generating map data as final results in accordance with a classification code table which determines final classification codes by combining classification codes for each of the plurality of processes. The inventive apparatus generates data maps in keeping with the multiple processes involved, and allows some of the semiconductor chips rejected as faulty in one test process but accepted as normal in another during the multiple-process wafer testing to be recovered as still useful in a way different from normally accepted chips.

According to a second aspect of the invention, there is provided a map data generating apparatus comprising: probers for generating map data from execution of each of a plurality of processes constituting wafer tests; and a cell controller for preserving the generated map data upon receipt thereof and for generating final classification codes through logical operations on the basis of a classification code obtained before a current process and a classification code obtained in a current process. This apparatus of the invention also allows some of the semiconductor chips rejected as faulty in one test process but accepted as normal in another during the multiple-process wafer testing to be recovered as still useful in a way different from normally accepted chips.

In a first preferred variation of the apparatus according to the first or the second aspect of the invention, the final classification codes may be determined by use of a corresponding table which is defined by a classification code obtained before a current process and a classification code obtained in the current processes. The apparatus of this preferred structure also allows some of the semiconductor chips rejected as faulty in one test process but accepted as normal in another during the multiple-process wafer testing to be recovered as still useful in a way different from normally accepted chips. In addition, when a specialized classification code table scheme is used to provide the apparently faulty chips with more detailed classification codes, these chips may be grouped in a more detailed and recoverable fashion than before.

In a second preferred variation of the apparatus according to the second aspect of the invention, the cell controller may define four logical operations: performing an AND of classification codes from the previous and current processes;

performing an OR of classification codes from the previous and current processes; causing a classification code from the previous process to substitute for a classification code from the current process; and causing a classification code from the current process to substitute for a classification code from the previous process. This variation of the invention supplements the benefits of the second aspect with the simplified settings by use of the defined expressions of logical operations. As a result, it is not necessary, given an increasing variety of classification codes, to make settings for each of the codes added. The number of settings need not grow in keeping with ever-increasing classification codes. Furthermore, this preferred apparatus allows chips judged faulty in any one of the processes to be recovered as still useful in a manner different from normally accepted chips.

In a third preferred variation of the apparatus according to the second aspect of the invention, when generating classification codes based on the defined expressions of logical operations, the cell controller establishes the classification codes in a distinct fashion for each of combinations of previous normal-faulty judgment results and current normal-faulty judgment results. This variation of the invention supplements the benefits of the second aspect with a need only to preserve temporarily the map data generated in each process while the process is in progress. Because there is no need to retain all map data until the final process is completed, the necessary memory capacity is reduced.

According to a third aspect of the invention, there is provided a map data generating method comprising the steps of:

generating map data from execution of each of a plurality of processes constituting wafer tests; and generating the map data as final results in accordance with a classification code table which determines final classification codes by combining classification codes for each of the plurality of processes. The inventive method generates data maps in keeping with the multiple processes involved, and allows some of the semiconductor chips rejected as faulty in one test process but accepted as normal in another during the multiple-process wafer testing to be recovered as still useful in a way different from normally accepted chips.

In a first preferred variation of the method according to the third aspect of the invention, the method may further comprise the step of generating final classification codes through logical operations on the basis of a classification code obtained before a current process and a classification code obtained in the current process. This preferred method of the invention also allows some of the semiconductor chips rejected as faulty in one test process but accepted as normal in another during the multiple-process wafer testing to be recovered as still useful in a way different from normally accepted chips.

In a second preferred variation of the method according to the third aspect of the invention or its first variation, the method may further comprise the step of determining the final classification codes by use of a corresponding table which is defined by a classification code obtained before a current process and a classification code obtained in the current processes. This preferred method also allows some of the semiconductor chips rejected as faulty in one test process but accepted as normal in another during the multiple-process wafer testing to be recovered as still useful in away different from normally accepted chips. In addition, when a specialized classification code table scheme is used to provide the apparently faulty chips with more detailed classification codes, these chips may be grouped in a more detailed and recoverable fashion than before.

In a third preferred variation of the method according to the first variation of the third aspect of the invention, the method may further comprise the step of defining four logical operations: performing an AND of classification codes from the previous and current processes; performing an OR of classification codes from the previous and current processes; causing a classification code from the previous process to substitute for a classification code from the current process; and causing a classification code from the current process to substitute for a classification code from the previous process. This variation of the invention supplements the benefits of the first preferred variation of the third aspect with the simplified settings by use of the defined expressions of logical operations. As a result, it is not necessary, given an increasing variety of classification codes, to make settings for each of the codes added. The number of settings need not grow in keeping with ever-increasing classification codes. Furthermore, this preferred method allows chips judged faulty in any one of the processes to be recovered as still useful in a manner different from normally accepted chips.

In a fourth preferred variation of the method according to the first variation of the third aspect of the invention, the method may further comprise, when generating classification codes based on the logical operations, the step of establishing the classification codes in a distinct fashion for each of combinations of previous normal-faulty judgment results and current normal-faulty judgment results. This preferred method supplements the benefits of the first preferred variation of the third aspect with a need only to preserve temporarily the map data generated in each process while the process is in progress. Because there is no need to retain all map data until the final process is completed, the necessary memory capacity is reduced.

The entire disclosure of Japanese Patent Application No. 2000-82665 filed on Mar. 23, 2000 including specification, claims, drawings and summary are incorporated herein by reference in its entirety.

What is claimed is:

1. A map data generating apparatus comprising:
   probers for generating map data corresponding to a plurality of test chips of a wafer from execution of each of a plurality of processes constituting wafer tests wherein each of the plurality of processes is performed on a respective test chip; and
   a cell controller for preserving the generated map data upon receipt thereof and for generating map data as final results in accordance with a classification code table which determines a final classification code for each respective test chip by combining classification codes for each of said plurality of processes.

2. A map data generating apparatus comprising:
   probers for generating map data corresponding to a plurality of test chips of a wafer from execution of each of a plurality of processes constituting wafer tests wherein each of the plurality of processes is performed on a respective test chip; and
   a cell controller for preserving the generated map data upon receipt thereof and for generating a final classification code for each respective test chip through logical operations on the basis of a classification code obtained corresponding to the execution of at least one of the plurality of processes before a current process and a classification code obtained in the current process.

3. The map data generating apparatus according to claim 1, wherein said final classification codes are determined by use of a corresponding table which is defined by a classification code obtained before a current process and a classification code obtained in the current processes.

4. The map data generating apparatus according to claim 2, wherein said final classification codes are determined by use of a corresponding table which is defined by a classification code obtained before a current process and a classification code obtained in the current processes.

5. The map data generating apparatus according to claim 2, wherein said cell controller defines four logical operations: performing an AND of classification codes from the previous and current processes; performing an OR of classification codes from the previous and current processes; causing a classification code from the previous process to substitute for a classification code from the current process; and causing a classification code from the current process to substitute for a classification code from the previous process.

6. The map data generating apparatus according to claim 2, wherein, when generating classification codes based on said logical operations, said cell controller establishes said classification codes in a distinct fashion for each of combinations of previous normal-faulty judgment results and current normal-faulty judgment results.

7. A map data generating method in which map data are generated corresponding to a plurality of test chips of a wafer from execution of each of a plurality of processes constituting wafer tests wherein each of the plurality of processes is performed on a respective test chip, said method comprising the step of generating map data as final results in accordance with a classification code table which determines a final classification code for each respective test chip by combining classification codes for each of said plurality of processes.

8. A map data generating method according to claim 6, further comprising the step of generating final classification codes through logical operations on the basis of a classification code obtained before a current process and a classification code obtained in the current process.

9. The map data generating method according to claim 7, further comprising the step of determining said final classification codes by use of a corresponding table which is defined by a classification code obtained before a current process and a classification code obtained in the current processes.

10. The map data generating method according to claim 8, further comprising the step of determining said final classification codes by use of a corresponding table which is defined by a classification code obtained before a current process and a classification code obtained in the current processes.

11. The map data generating method according to claim 8, further comprising the step of defining four logical operations: performing an AND of classification codes from the previous and current processes; performing an OR of classification codes from the previous and current processes; causing a classification code from the previous process to substitute for a classification code from the current process; and causing a classification code from the current process to substitute for a classification code from the previous process.

12. The map data generating method according to claim 8, further comprising, when generating classification codes based on said logical operations, the step of establishing said classification codes in a distinct fashion for each of combinations of previous normal-faulty judgment results and current normal-faulty judgment results.

* * * * *